United States Patent
Nuzzio

(12) 
(10) Patent No.: US 6,302,565 B1
(45) Date of Patent: *Oct. 16, 2001

(54) PROTECTIVE SHUTTER SYSTEM FOR ENERGY SOURCE

(75) Inventor: Donald B. Nuzzio, Ringoes, NJ (US)

(73) Assignee: Analytical Instrument Systems, Inc., Flemington, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/877,146

(22) Filed: Jun. 17, 1997

(51) Int. Cl.$^7$ ........................................ F21V 17/02
(52) U.S. Cl. ................... 362/321; 362/324; 362/281; 362/351; 362/551
(58) Field of Search .................... 362/581, 551, 362/351, 574, 321, 322, 323, 324, 280, 282, 284

(56) References Cited

U.S. PATENT DOCUMENTS

| | | | |
|---|---|---|---|
| 4,350,417 | * | 9/1982 | Freeman ................................ 353/90 |
| 4,366,529 | * | 12/1982 | Takashashi et al. .................... 362/4 |
| 4,487,489 | * | 12/1984 | Takamatsu ............................ 354/62 |
| 5,150,257 | * | 9/1992 | Mohabbatizadeh et al. ........ 359/601 |
| 5,184,883 | * | 2/1993 | Finch et al. ........................... 362/32 |
| 5,400,174 | * | 3/1995 | Dreessen et al. .................... 359/385 |

OTHER PUBLICATIONS

Advertisement entitled "D$_2$LUX™ High–Intensity UV Deuterium Light Source for Fiber Optics."

* cited by examiner

*Primary Examiner*—Sandra O'Shea
*Assistant Examiner*—John Anthony Ward
(74) *Attorney, Agent, or Firm*—Rohm & Monsanto, PLC

(57) ABSTRACT

A protective arrangement for a source of electromagnetic energy, such as an output light, is provided with a light port for issuing the output light and a displaceable shutter having a first position that overlies the light port and thereby limits access to the output light. In a second position, the displaceable shutter permits ready access to the light port. The displaceable shutter is arranged to default to the first position, whereby protection of personnel from the output light is effected. This can be achieved by configuring the displaceable shutter to be affected by gravity, or in environments where the equipment is portable or its orientation in use can be varied, by a resilient biasing element, such as a spring. An indicator arrangement is provided to provide indication that light is being emitted from the light port. Additionally, an embodiment of the invention provides disabling of the propagation of the output light when the shutter is displaced to the second position, there being further provided an interlock override that energizes or otherwise enables the propagation of the output light, such as by the coupling of a light conduit to the light port.

20 Claims, 3 Drawing Sheets

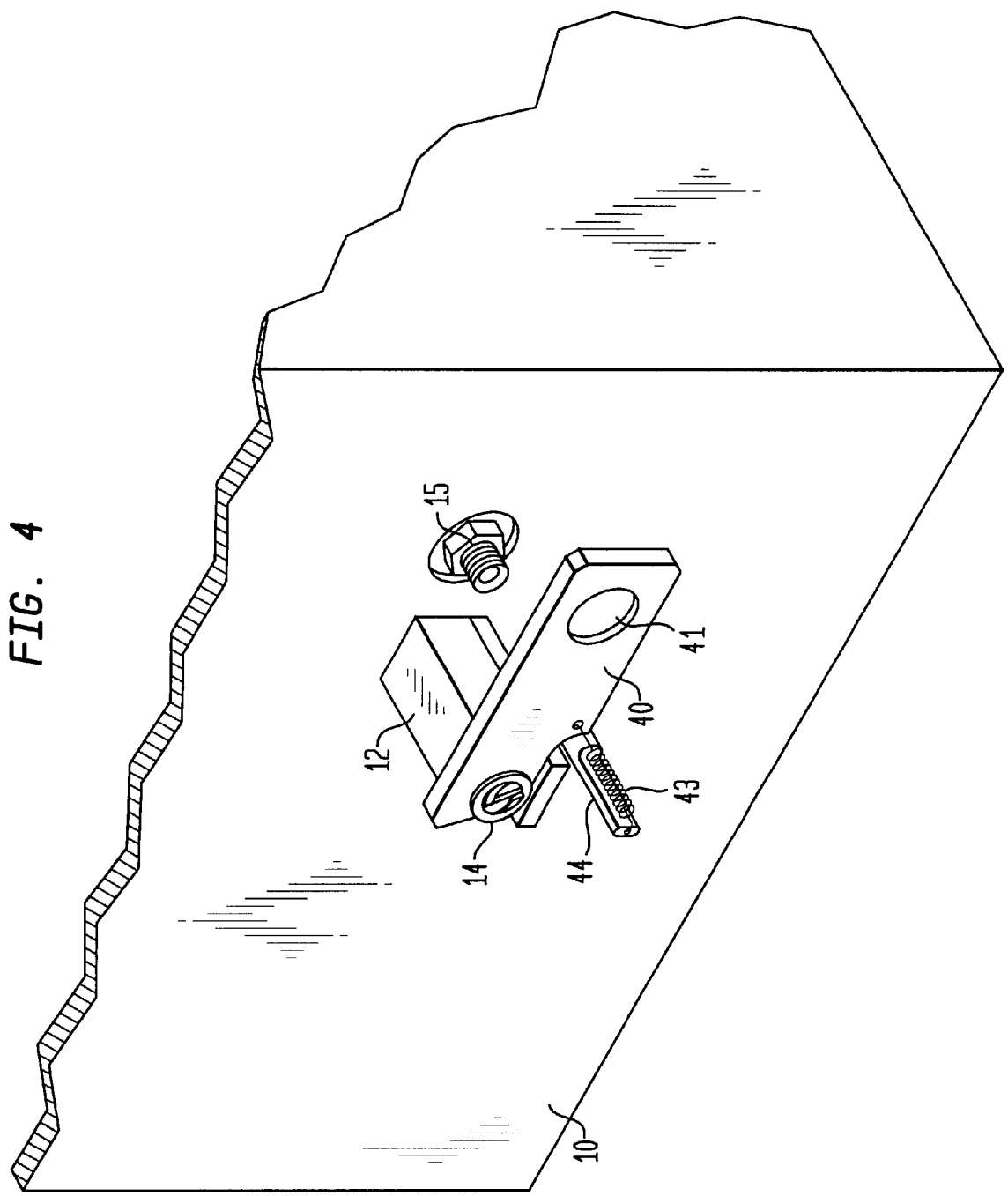

PROTECTIVE SHUTTER SYSTEM FOR ENERGY SOURCE

BACKGROUND OF THE INVENTION

1. Field of the Invention

This invention relates generally to sources of electromagnetic energy having amplitudes or other characteristics that can cause injury to a human operator, and more particularly, to an arrangement for protecting the human operator and others from inadvertent viewing of, or other exposure to, the electromagnetic energy.

2. Description of the Related Art

Sources of electromagnetic radiation, particularly light beams, are advancing technologically to very high output amplitudes and intensities, sufficient to cause injury to personnel. Moreover, the light beams often are characterized by frequency distributions that extend beyond the visible range, whereby it is not readily apparent to a user that he or she is being exposed to injurious levels of energy.

In several known arrangements, a source of electromagnetic energy, such as an intense light source, is enclosed within a housing, and there is provided a port that permits the light from the source to be propagated outside of the housing. Oftentimes, the port is of a known type, which may include a conventional SMA fitting to which can readily be connected a fiber optic conduit. However, in the course of attaching the conduit to the fitting, the system operator may inadvertently permit injurious levels of the energy to impinge upon him or her, particularly in the eyes. Sometimes, the electromagnetic energy has a visible component that may serve to warn the operator that the light source is energized. However, the light beam propagated through the port may contain significant intensities of ultraviolet or infrared energy which is not visible. In fact, the visible component may be of sufficiently low intensity to deceive the operator into believing that the invisible components, if any, are also of low intensity. Exposure to the high intensity invisible components can result in burn lesions or loss of eyesight.

There is, therefore, a need for an arrangement that protects personnel from this industrial hazard.

It is therefore, an object of this invention to provide a protective arrangement that blocks a light port to preclude inadvertent viewing or other exposure to the electromagnetic radiation being emitted therefrom.

It is another object of this invention to provide a protective arrangement that is simple and economical and can provide ready access to a light port with security from inadvertent exposure to the emitted light.

It is also an object of this invention to provide a protective arrangement that provides a visual indication that a light is being emitted from a light port.

It is a further object of this invention to provide a protective arrangement that functions to effect safety irrespective of the orientation of the equipment on which it is employed.

It is additionally an object of this invention to provide a simple and economical protective arrangement that can be overridden with security from inadvertent exposure to the emitted electromagnetic radiation.

It is yet a further object of this invention to provide a protective arrangement that precludes inadvertent viewing of a potentially injurious level of electromagnetic radiation being emitted from an energy port, the protection being provided irrespective of the availability of electrical power.

It is also another object of this invention to provide a protective arrangement that provides indication of the presence of emitted electromagnetic radiation without the need to communicate electrically with the energization circuitry to the light source.

SUMMARY OF THE INVENTION

The foregoing and other objects are achieved by this invention which provide, in a first apparatus aspect thereof, a protective arrangement for a light source, wherein a user of the light source is protected from exposure to the light. In accordance with the invention, a light port is provided for issuing an output light having an intensity that is sufficient to cause injury to an operator, particularly the eyes of the operator. A displaceable shutter is arranged to have a first position that overlies the light port whereby access to the light port, and the viewing of the output light are limited. While in a second position, the displaceable shutter permits ready access to the light port. There is additionally provided an arrangement for urging the displaceable shutter toward the first position.

In accordance with a specific illustrative embodiment of the invention, the arrangement for urging the displaceable shutter toward the first position includes a gravity-responsive biasing element. In such an arrangement, gravity itself urges the displaceable shutter to limit access to the light port. In a further embodiment, the arrangement for urging the displaceable shutter toward the first position includes a resilient biasing element, such as a spring. The use of such a resilient biasing element insures that the protection afforded by the displaceable shutter is available irrespective of the orientation of a light source, or any equipment in which it is installed.

In one highly advantageous embodiment of the invention, there is provided an indicator for indicating that the output light is being issued from the light port. This is particularly advantageous in arrangements where the output light is not within the visible range. In one highly advantageous embodiment of the invention, the indicator is installed directly on the displaceable shutter. One arrangement for effecting such an indicator without the need for complex circuitry employs a filter, that in some embodiments may be coated with a phosphorescent or florescent material that produces a visible indication in response to the impingement thereof by the otherwise invisible output light.

In accordance with a further embodiment of the invention, there is provided an interlock coupled to the displaceable shutter for disabling the output light when the displaceable shutter is in the second position. In such an arrangement, the interlock would function to discontinue the issuance of the output light when the displaceable shutter is moved to a position where the light port is readily accessible. In a further embodiment of such an arrangement, the interlock further includes an override arrangement coupled to the light port that would enable the output light when the displaceable shutter is in the second position. Such an override includes, for example, a switching arrangement in the light port that would reenergize the output light when a fiber optic cable is installed in the light port.

In accordance with a further apparatus aspect of the invention, there is provided an arrangement for coupling a light source having a source output light to a detachable light conduit. In accordance with the invention, the arrangement is provided with a housing for enclosing the light source, and a light port arrangement through the housing for propagating at least a portion of the source output light to the exterior of the housing. A displaceable shutter having a first position that overlies the light port is provided, whereby access to the light port and viewing of the propagated portion of the source output light is limited. The displaceable shutter has a second position wherein the light port readily can be accessed. There is additionally provided an arrangement for urging the displaceable shutter toward the first position wherein access to the light port and the viewing of the propagated portion of the source light is limited and preferably prevented altogether.

In one embodiment of this further aspect of the invention, there is additionally provided a coupling arrangement for coupling the light source in fixed relation within the housing and in fixed relation to the light port. This is particularly useful in embodiments where the light source is not directly coupled to the light port, such as by an optical conduit, but instead is directed to illuminate the light port from the interior of the housing.

In a specific embodiment of the invention, the arrangement for urging the displaceable shutter toward the first position includes configuring the displaceable shutter such that gravity will urge same toward the first position. In other embodiments, however, such urging can be achieved by a resilient biasing member, such as a spring.

As previously described, there is preferably provided an indicator for indicating that at least a portion of the source light is being issued from the light port. The indicator is installed, in one embodiment, on the displaceable shutter so as to provide a visual indication responsive to the output light being issued from the light port. Alternatively, other forms of indicator can be provided, such as a visual indicator responsible to the energization of the light source. Such visual indicator, of course, need not be located on the displaceable shutter.

Also as previously described, an interlock arrangement can be provided coupled to the displaceable shutter for discontinuing the propagation of the portion of a source output light to the exterior of the housing when the displaceable shutter is in the second position. Such an interlock may be a mechanical arrangement that blocks the light from the source from reaching the light port or an electrical arrangement that yields a similar effect, or discontinues energy to the light source. An override arrangement will serve to enable the propagation of output light when the displaceable shutter is in the second position.

In accordance with a method aspect of the invention, there is provided a method of protecting a user of a source of electromagnetic energy from inadvertent exposure thereto. The method includes the steps of:

urging a displaceable shutter to a first position externally over a light port that issues the electromagnetic energy, whereby the light port cannot directly be viewed;

disabling propagation of the electromagnetic energy via the light port while the displaceable shutter is urged to a second position, whereby the light port can directly be viewed;

inserting a conduit into the light port; and enabling propagation of the electromagnetic energy via the light port in response to the step of inserting.

In one embodiment of this method aspect of the invention, the step of disabling includes the further step of deenergizing the source of electromagnetic energy.

In a further embodiment of the method aspect of the invention, the step of disabling includes the further step of blocking propagation of the electromagnetic energy from the source of electromagnetic energy to the light port.

BRIEF DESCRIPTION OF THE DRAWING

Comprehension of the invention is facilitated by reading the following detailed description, in conjunction with the annexed drawing, in which:

FIG. 4 is a partially fragmented isometric representation of a specific illustrative embodiment of the invention showing an indicator on the displaceable shutter that reacts with a visual indication in response to the impingement thereon of light from the light port.

DETAILED DESCRIPTION

Figure 1:
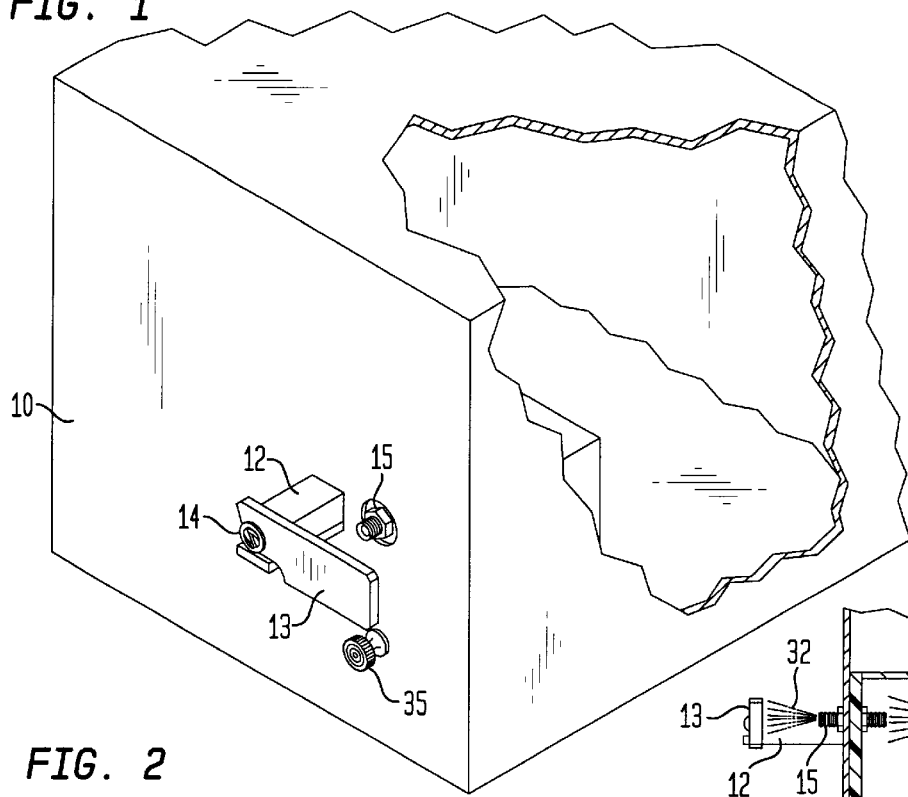
FIG. 1 is a partially fragmented isometric representation of a specific illustrative embodiment of the invention showing a displaceable shutter in a first position wherein access to a light port is limited.

FIG. 1 is a partially fragmented isometric representation of a specific illustrative embodiment of the invention showing a displaceable shutter in a first position wherein access to a light port is limited. As shown, a housing 10 has a stanchion 12 extending therefrom. Stanchion 12 is fixed to the housing and has installed thereon a shutter 13 that is pivotally displaceable about a pivot 14 which may, in this specific illustrative embodiment of the invention, be configured as a tamper-proof screw that precludes easy removal of the displaceable shutter.

Shutter 13 is shown to be in a first pivotal position, wherein it overlies a light port 15. As will be described below, light port 15 issues an electromagnetic energy (not shown), that may be a beam of light of sufficient intensity to injure a human operator (not shown) of the arrangement.

Figure 2:
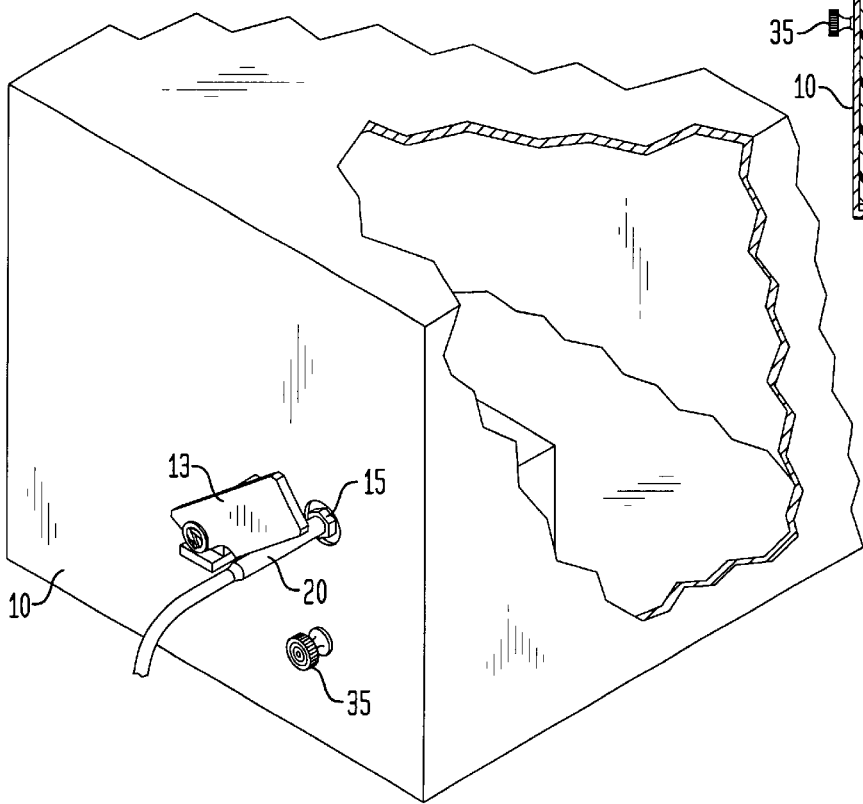
FIG. 2 is a partially fragmented representation of the specific illustrative embodiment of FIG. 1 showing the displaceable shutter in a second position wherein the light port is accessible.

FIG. 2 is a partially fragmented isometric representation of the specific illustrative embodiment of FIG. 1 showing displaceable shutter 13 in a second position wherein light port 15 is sufficiently accessible so that a light conduit 20, which may be in the form of a length of optical fiber. While the shutter is in the first position (FIG. 1), the human operator is precluded from viewing the light port directly, thereby preventing damage to his or her eyesight. Also, it can be seen that any illumination from the light port, while shutter 13 is in this first position, will impinge upon the back side, (not shown in this figure) of the shutter. Any of a variety of known surface finishes can be applied to the back side of the shutter to prevent undesired reflection of the electromagnetic energy.

Figure 3:
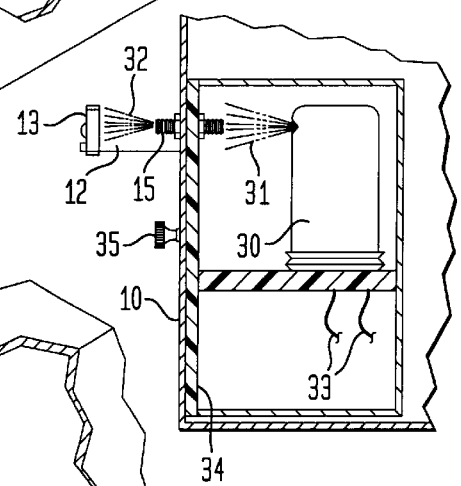
FIG. 3 is a partially cross-sectional side plan representation of the embodiment of FIG. 1 showing a light source illuminating the light port from within the housing.

FIG. 3 is a partially cross-sectional side plan representation of the embodiment of FIG. 1 showing a light source 30 illuminating light port 15 from within the housing. In this specific illustrative embodiment of the invention, a light 31 from the light source is directed toward light port 15, a portion of which light exits as light 32 from the light port. The light source is shown to receive an electrical energy via electrical leads.

Light source 30 is shown in this embodiment to be contained within a subhousing 34. The subhousing is attached to housing 10, illustratively by a fastener 35, which in this embodiment is shown to be of the well-known hand-tightenable variety. This arrangement permits ready removal and replacement of the light source and its associated structure. In some embodiments, the removable subhousing contains control circuitry (not shown) for the light source.

FIG. 4 is a partially fragmented isometric representation of a specific illustrative embodiment of the invention showing an indicator 41 on displaceable shutter 40. Elements of structure that are analogous to elements previously described are identically designated. Indicator 41, in this specific illustrative embodiment of the invention, is in the form of a filter that safely permits the human operator (not shown) to view the electromagnetic energy (not shown) that issues from light port 15. In other embodiments of the invention, indicator 41 is in the form of a filter having a phosphorescent or fluorescent coating thereon that reacts with the electromagnetic energy to provide a glowing visual indication in response to the impingement thereon of light from the light port.

FIG. 4 further shows a resilient biasing element 43, in the form of a spring, that is arranged to urge shutter 40 toward the first position, i.e., where it substantially blocks access to light port 15, as shown. In this specific illustrative embodiment of the invention, the spring is coupled to a further stanchion 44 that extends outward of housing 10, in a manner similar to stanchion 12. Of course, persons of skill in the art can configure any of a number of other biasing arrangements that would urge the displaceable shutter into the first position. Such other arrangements can include, for example other forms of springs incorporated into pivot 14. In other embodiments, particularly where the equipment is not intended to be oriented in other positions, gravity itself will urge a properly configured displaceable shutter into the first position.

Figure 5:
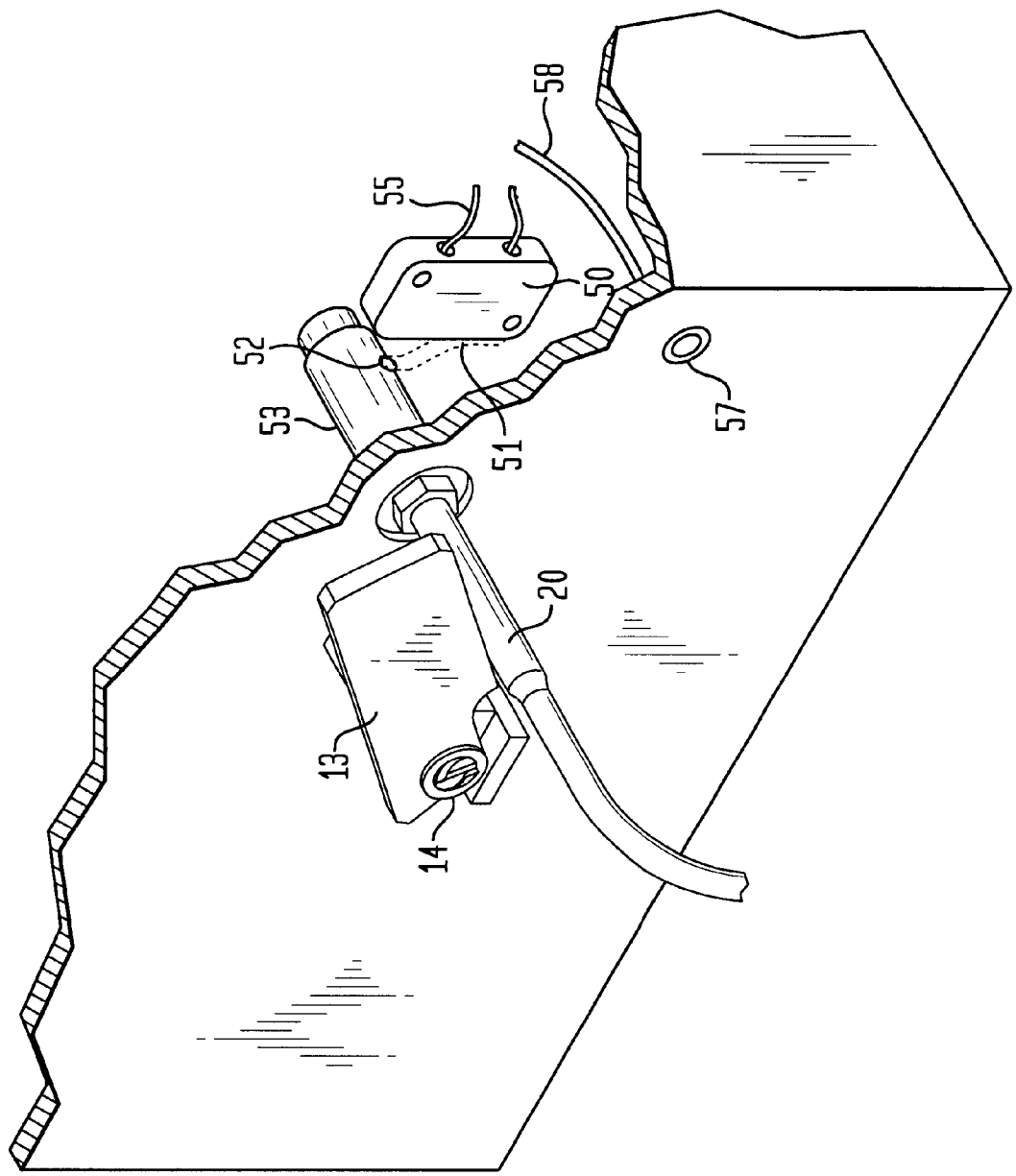
FIG. 5 is a partially fragmented isometric representation of a specific illustrative embodiment of the invention showing the displaceable shutter in a second position wherein the light port is accessible, and further an electrical interlock that controls electrical energy to the light source (not shown) in response to the insertion of an optical fiber into the light port.

FIG. 5 is a partially fragmented isometric representation of a specific illustrative embodiment of the invention showing displaceable shutter 13 in the second position wherein light port 15 is accessible, and further shows an electrical interlock, in the form of a micro switch 50 that controls electrical energy to the light source (not shown) in response to the insertion of optical fiber 20 into the light port. Micro switch 50 is provided with an actuation arm 51 (shown partially in phantom) that is arcuately displaced in response to a ball bearing 52. The ball bearing is installed in the wall of a collar 53 and is urged radially outward therefrom in response to the insertion of the optical fiber. The micro switch is additionally provided with leads 55 that connect electrically with a control circuit (not shown) that includes electrical leads 33 (FIG. 3) of light source 30. Thus, insertion of the optical fiber will result in a change in the conductive state of the micro switch, which would enable the light source. In such an embodiment, it may be desirable to provide an indicator, such as an indicator lamp 57 that is provided with an electrical lead 58 for coupling to the control circuit, and thereby provide indication that the light source has been energized.

In other embodiments of the invention, the safety aspects of the present invention can be achieved with an entirely mechanical arrangement. For example, a dual shutter arrangement (not shown) can be provided whereby one shutter is arranged external to the housing, similar to displaceable shutter 13, and a second displaceable shutter (not shown) is, for example, coaxially arranged on pivot 14 in the interior of the housing, and resiliently coupled to the pivot. While shutter 13 is in the first position, the internal shutter is disposed below the light port, so as to permit the light source to illuminate the light port, similar to the operating condition shown in FIG. 3. Displaceable shutter 13 prevents direct viewing of the electromagnetic energy in this position. However, when displaceable shutter 13 is raised to the second position, the internal shutter is pivotally raised to block the illumination of the light port from within. Thus, the electromagnetic energy being issued by the light source cannot be viewed even when displaceable shutter 13 is in the second position. In such an embodiment, there is provided a mechanical arrangement such that, upon insertion of the optical fiber into the light port, the internal shutter is mechanically urged to the original position beneath the light port. Thus, illumination of the light port is permitted. When the optical fiber is removed, the internal shutter resumes the blocking of the electromagnetic energy, until shutter 13 is returned to the first position, whereupon the internal shutter is restored to its first position beneath the light port, and displaceable shutter 13 resumes the blocking function.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. A protective arrangement for a light source, the protective arrangement comprising:
   a light output for issuing an output light having an intensity sufficient to cause injury to the eye of an operator;
   a coupler disposed in predetermined relation to said light output for coupling with a light conduit whereby said light output delivers the output light to said light conduit;
   a displaceable shutter having a first position overlying said light output and said coupler, whereby access to said coupler and viewing of the output light are limited, and a second position wherein said coupler readily can be accessed by the operator; and
   an arrangement for urging said displaceable shutter toward the first position.

2. The protective arrangement of claim 1, wherein said arrangement for urging comprises a gravity-responsive biasing element.

3. The protective arrangement of claim 1, wherein said arrangement for urging comprises a resilient biasing element.

4. The protective arrangement of claim 1, wherein there is further provided an indicator for indicating that the output light is being issued from said light output.

5. The protective arrangement of claim 4, wherein said indicator is installed on said displaceable shutter.

6. The protective arrangement of claim 5, wherein said indicator provides a visual indication in response to the output light from said light output.

7. The protective arrangement of claim 1, wherein there is further provided interlock coupled to said displaceable shutter for disabling the output light when said displaceable shutter is in said second position.

8. The protective arrangement of claim 7, wherein there is further provided interlock override means coupled to said light output for enabling said output light when said displaceable shutter is in said second position.

9. An arrangement for coupling a light source having a source output light to a detachable light conduit, the arrangement comprising:

a housing for enclosing the light source;

a light port arranged through the housing for propagating at least a portion of the source output light to the exterior of said housing and facilitating engagement with a light conduit;

a displaceable shutter having a first position overlying said light port whereby access to said light port for engaging the light conduit therewith and viewing of the propagated portion of the source output light are limited, and a second position wherein said light port readily can be accessed by the operator; and an arrangement for urging said displaceable shutter toward the first position.

10. The arrangement of claim 9, wherein there is further provided a coupler for coupling the light source in fixed relation within said housing and in fixed relation to said light port.

11. The arrangement of claim 9, wherein said arrangement for urging comprises a gravity-responsive biasing element.

12. The arrangement of claim 9, wherein said arrangement for urging comprises a resilient biasing element.

13. The arrangement of claim 9, wherein there is further provided an indicator for indicating that at least a portion of the source output light is being issued from said light port means.

14. The arrangement of claim 13, wherein said indicator is installed on said displaceable shutter.

15. The arrangement of claim 14, wherein said indicator provides a visual indication in response to the output light being issued from said light port means.

16. The arrangement of claim 9, wherein there is further provided an interlock for discontinuing the propagation of the portion of the source output light to the exterior of said housing when said displaceable shutter is in said second position.

17. The protective arrangement of claim 16, wherein there is further provided interlock override means coupled to said light output for enabling said output light when said displaceable shutter is in said second position.

18. A method of protecting a user of a source of electromagnetic energy from inadvertent exposure thereto, the method comprising the steps of:

urging a displaceable shutter to a first position externally over a light port that issues the electromagnetic energy, whereby the light port cannot directly be viewed, the light port being adapted to be engageable with a light conduit for propagating the electromagnetic energy therethrough;

disabling propagation of the electromagnetic energy via the light port while the displaceable shutter is urged to a second position, whereby the light port can directly be viewed by the operator;

engaging the light conduit with the light port; and enabling propagation of the electromagnetic energy via the light port in response to said step of engaging.

19. The method of claim 18, wherein said step of disabling includes the further step of deenergizing the source of electromagnetic energy.

20. The method of claim 18, wherein said step of disabling includes the further step of blocking propagation of the electromagnetic energy from the source of electromagnetic energy to the light port.

* * * * *